(12) United States Patent
Kim et al.

(10) Patent No.: US 7,453,093 B2
(45) Date of Patent: Nov. 18, 2008

(54) LED PACKAGE AND FABRICATING METHOD THEREOF

(75) Inventors: Yong Suk Kim, Kyungki-do (KR); Young Soo Oh, Kyungki-do (KR); Hyoung Ho Kim, Kyungki-do (KR); Taek Jung Lee, kyungki-do (KR); Seog Moon Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 200 days.

(21) Appl. No.: 11/489,578

(22) Filed: Jul. 20, 2006

(65) Prior Publication Data

US 2007/0018190 A1    Jan. 25, 2007

(30) Foreign Application Priority Data

Jul. 20, 2005    (KR) .................... 10-2005-0066010

(51) Int. Cl.
*H01L 27/15* (2006.01)
*H01L 23/34* (2006.01)

(52) U.S. Cl. .................... 257/79; 257/712; 257/99; 257/E51.018; 257/E33.001

(58) Field of Classification Search .................... 257/79, 257/81, 91, 93, 95, 98, 99, 100, 712, 717, 257/718, 720, E51.018, E33.001, E33.077, 257/E31.058
See application file for complete search history.

(56) References Cited

U.S. PATENT DOCUMENTS

2004/0173808 A1*    9/2004    Wu .............................. 257/99

* cited by examiner

*Primary Examiner*—Howard Weiss
*Assistant Examiner*—Hoa B Trinh
(74) *Attorney, Agent, or Firm*—McDermott Will & Emery LLP

(57) ABSTRACT

The invention provides an LED package capable of effectively releasing heat emitted from an LED chip out of the package and a fabrication method thereof. For this purpose, at least one groove is formed on an underside surface of the substrate to package the LED chip and the groove is filled with carbon nanotube material. In the LED package, a substrate having at least one groove on the underside surface is prepared. A plurality of electrodes are formed on a top surface of the substrate. Also, at least the one LED chip is mounted over the substrate to have both terminals electrically connected to the upper electrodes. In addition, carbon nanotube filler is filled in the groove of the substrate.

9 Claims, 3 Drawing Sheets

LED PACKAGE AND FABRICATING METHOD THEREOF

CLAIM OF PRIORITY

This application claims the benefit of Korean Patent Application No. 2005-66010 filed on Jul. 20, 2005 in the Korean Intellectual Property Office, the disclosure of which is incorporated herein by reference.

BACKGROUND OF THE INVENTION

1. Field of the Invention

The present invention relates to a light emitting diode (LED) package, more particularly, which has at least one groove formed on an underside surface of a substrate to package the LED and filled with carbon nanotube (CNT) material so that heat transferred from an LED chip can be effectively released out of the package, and a fabrication method thereof.

2. Description of the Related Art

In general, a Light Emitting Diode (LED) converts into light an energy generated by recombination of electrons and holes injected. The LED includes a red LED using GaAsP and a green LED using GaP. Also, recently, a nitride semiconductor using nitride such as GaN has been highlighted noticeably as a core material for opto-electronic materials and electronic devices owing to its excellent physical and chemical properties. The nitride LED is capable of generating green, blue and even ultraviolet ray light. Technical advancement has dramatically enhanced luminance of the nitride LED, which is thus rendered applicable in full-color sign boards and lighting devices, and the like. The LED can be packaged in various forms depending on its applications.

Meanwhile, when employed in an area requiring high-luminance such as lighting devices, the LED generates a massive amount of heat due to increase in its power consumption. Such heat, if not effectively released out of the package, may potentially degrade properties of the LED and shorten useful life thereof.

To overcome the heat generation problems, conventionally, an LED package was installed with a heat releasing means using metal material with high thermal conductivity such as Cu, Al, and Ag. The metal material such as Cu, Al, and Ag purportedly is low in thermal resistance and high in thermal conductivity. But the metal material is prone to oxidation in the air, and suffers from void formation due to electron migration resulting from a voltage impressed. These drawbacks prevent heat from being released effectively, thus undermining LED's operational properties and reliability.

SUMMARY OF THE INVENTION

The present invention has been made to solve the foregoing problems of the prior art and therefore an object according to certain embodiments of the present invention is to provide an LED package which has at least one groove formed in a package substrate and filled with high thermal conductivity carbon nanotube material to improve heat release properties thereof.

Another object according to certain embodiments of the present invention is to provide a method for fabricating the LED package.

According to an aspect of the invention for realizing the object, there is provided a light emitting diode package comprising: a substrate having at least one groove formed on an underside surface thereof; a plurality of upper electrodes formed on a top surface of the substrate; at least one light emitting diode chip mounted over the substrate, the light emitting diode chip having both terminals electrically connected to the upper electrodes; and a carbon nanotube filler filled in the groove of the substrate.

According to a certain embodiment of the invention, preferably, the substrate includes at least one via hole formed underneath the upper electrodes to perforate the top and underside surfaces thereof. The via hole is filled with a conductive filler. Also, the light emitting diode package further comprises a plurality of lower electrodes formed on the underside surface of the substrate to electrically connect to a conductive filler filled in the via hole.

According to a certain embodiment of the invention, the light emitting diode package further comprises an insulating film formed on the top and underside surfaces of the substrate, and inner walls of the groove and the via hole.

Preferably, the insulating film comprises $SiO_2$, which can be formed on the Si substrate via a simple process.

According to a certain embodiment of the invention, the light emitting diode package further comprises a reflecting structure formed around the light emitting diode chip mounted over the substrate, the reflecting structure having an inclined surface for reflecting light emitted from the light emitting diode chip upwards. In addition, the light emitting diode package further comprises a lens attached to the reflecting structure over the light emitting diode, the lens controlling a direction of light emitted from the light emitting diode.

According to a certain embodiment of the invention, the groove is formed on the underside surface of the substrate in various configurations. For example, the groove comprises a plurality of holes extending from the underside surface of the substrate toward the top surface of the substrate without perforating the substrate. Alternatively, the groove comprises a plurality of slits extending from the underside surface of the substrate toward the top surface of the substrate without perforating the substrate.

According to another aspect of the invention for realizing the object, there is provided a method for fabricating a light emitting diode package comprising steps of:

preparing a substrate and a carbon nanotube paste;
forming a groove on an underside surface of the substrate;
filling the groove with the carbon nanotube paste;
forming a plurality of upper electrodes on a top surface of the substrate; and
mounting at least one light emitting diode chip over the substrate to electrically connect to the upper electrodes.

According to a certain embodiment of the invention, preferably, the step of forming the groove comprises:

forming an insulating film on the top and underside surfaces of the substrate; partially removing the insulating film on the underside surface of the substrate and a lower part of the substrate to form at least one groove; partially removing the insulating film on the top and underside surfaces of the substrate and the substrate so that a via hole is formed underneath the upper electrodes to perforate the top and underside surfaces of the substrate; forming an insulating film on inner walls of the groove and the via hole; and filling a conductive filler in the via hole.

At this time, preferably, the substrate comprises a Si substrate, and the step of forming the insulating film on the top and underside surfaces of the substrate and the step of forming the insulating film on the inner walls of the groove and the via hole comprise thermally treating the Si substrate in an oxygen atmosphere to form a $SiO_2$ insulating film on an exposed surface of the Si substrate.

According to a certain embodiment of the invention, preferably, the step of preparing the carbon nanotube paste comprises:

mixing carbon nanotube powder with binder, solvent and dispersant at a predetermined rate; filtering the mixture; and aging the filtered mixture to complete the carbon nanotube paste.

According to a certain embodiment of the invention, the step of forming the groove comprises forming a plurality of holes extending from the underside surface of the substrate toward the top surface of the substrate without perforating the substrate. Alternatively, the step of forming the groove comprises:

forming a plurality of slits extending from the underside surface of the substrate toward the top surface of the substrate without perforating the substrate.

According to a certain embodiment of the invention, the step of filling the carbon nanotube paste comprises:

coating the carbon nanotube paste onto the groove of the substrate; filling the nanotube paste in the groove via screen printing or spin coating; and drying the filled carbon nanotube paste.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
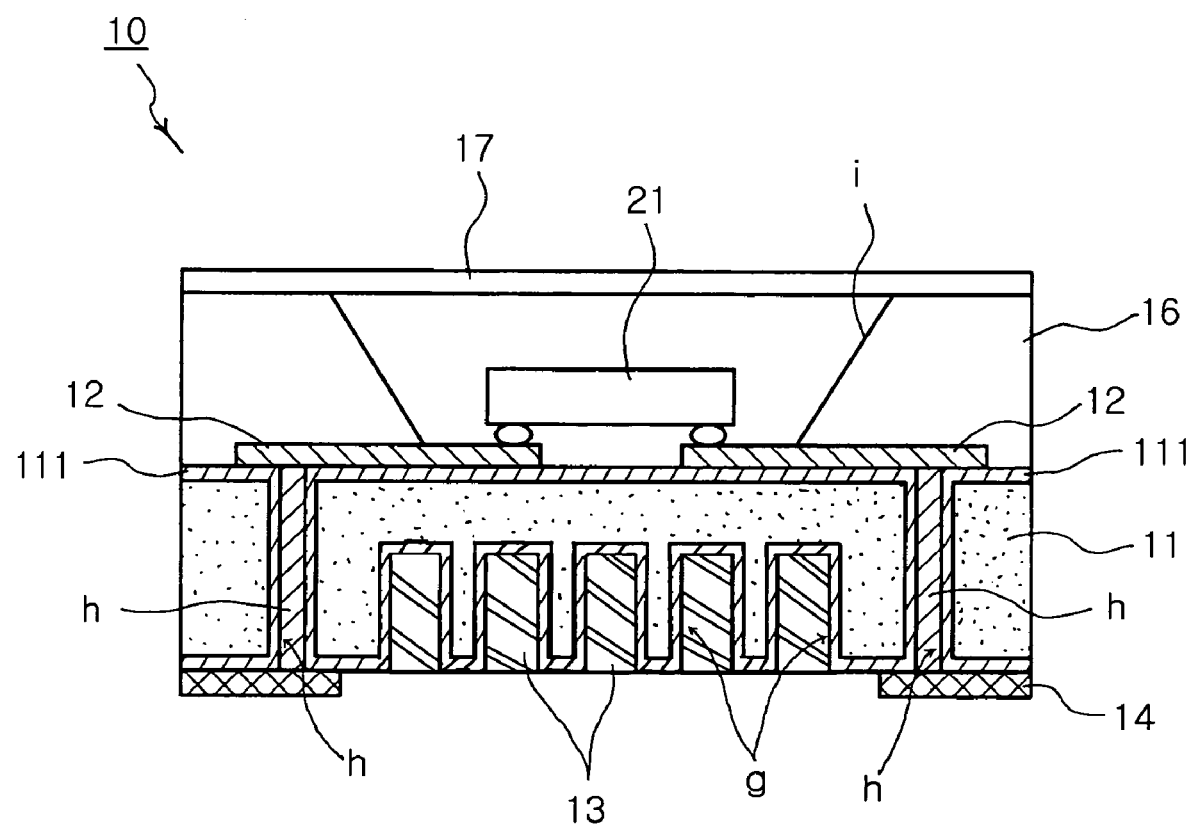
FIG. 1 is vertical cross-sectional view illustrating an LED package according to the invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

FIG. 1 is a vertical cross-sectional view illustrating an LED package according to a certain embodiment of the invention. Referring to FIG. 1, the LED package 10 according to the embodiment of the invention includes a substrate 11, a plurality of upper electrodes 12, an LED chip 21, and carbon nanotube filler 13. The substrate 11 has a plurality of grooves g formed on an underside surface thereof. The upper electrodes 12 are formed on a top surface of the substrate 11. The LED chip 21 is mounted over the substrate and has both terminals electrically connected to the upper electrodes 12. Also, the carbon nanotube filler 13 is filled in the grooves g of the substrate 11.

Moreover, according to this embodiment, the LED package further includes a reflecting structure 16 having an inclined surface i formed around the LED chip 21 mounted over the substrate 11. The inclined surface i reflects light emitted from the LED 21 upwards. Also, the LED package further includes a lens 17 attached to the reflecting structure and disposed over the LED chip 21. The lens 17 controls a direction of light emitted from the LED chip 21.

The substrate 11 is exemplified by various general commercial substrates. For example, the substrate 11 is selected from a group consisting of an insulating ceramic substrate, a glass substrate or a conductive Si substrate, and a metal substrate. Especially the Si substrate is a commercial substrate widely utilized in manufacturing a semiconductor device. The Si substrate is cheap, easily processable and relatively highly thermal conductive. This embodiment of the invention employs the Si substrate.

The substrate 11 includes grooves g formed on the underside surface thereof and via holes h formed underneath the upper electrodes 12. The via hole h perforates the top and underside surfaces of the substrate. Preferably, the via hole h is filled with a conductive filler 15. At this time, the LED package may further include a plurality of lower electrodes 14 disposed on the underside of the substrate 11 and electrically connected to the conductive filler 15 filled in the via hole h.

The conductive Si substrate, when adopted for the substrate 11, needs to have an insulating film 111 disposed thereon before forming terminals for electrical connection so that it can mount an electrical device thereon.

The insulating film 111 is formed to insulate the Si substrate that is electrically conductive. The insulating film 111 is formed on a surface (top or underside) of the substrate 11 via a separate deposition process. Alternatively, the Si substrate is thermally treated in an oxygen atmosphere to form a $SiO_2$ insulating film having excellent insulating properties. The Si substrate advantageously allows the insulating film to be easily formed via a simple thermal treatment process. The insulating film 111 is necessarily formed on the top and underside surfaces of the substrate and also on inner walls of the grooves g filled with the carbon nanotube filler and via holes h filled with the conductive filler.

Meanwhile, preferably, the grooves g are formed on the underside surface of the substrate 11, below the LED 21 mounted over the substrate 11. The grooves g are filled with the carbon nantotube filler having superior thermal conductivity. The grooves g allow heat generated in the LED 21 to be easily discharged to the underside surface of the substrate through the carbon nanotube filler 13.

The invention is characterized by filling the carbon nanotube filler 13 in the grooves g to release heat. Carbon nanotube is a new tubular (cylindrical) material having hexagons of six carbons connected with one another into the form of a tube (cylinder). The carbon nanotube is named as such due to its diameter of mere up to several nanometers. The carbon nanotube has electrical conductivity similar to that of copper, thermal conductivity similar to that of diamond, the highest in the natural world and strength ten thousand times that of steel. Carbon fiber, if transformed only 1%, is breakable. But the carbon nanotube is durable even if transformed 15%. The carbon nanotube has tensile force superior to that of diamond. There is a prospect that the carbon nanotube is widely used for materials for the high-tech electronics industry and daily life. Also, the carbon nanotube is applicable infinitely according to development of related technologies, as exemplified by thin Cathod Ray Tube (CRT) consuming extremely little power, alternative materials for bulbs, ultrahigh strength fiber such as spacesuits, mobile phone battery, hydrogen fuel cell, sensor, and the like.

As described above, the carbon nanotube exhibits very excellent thermal conductivity. In comparison with Cu (about 400 W/mK of thermal conductivity) and Al (about 203 W/mK of thermal conductivity) known to have high thermal conductivity, the carbon nanotube has a very high thermal conductivity of about 3000 W/mK at a temperature of 100K or more and about 3700 W/mK at a temperature of 100K or less. Therefore, this allows heat to be effectively released out of the LED package.

Figure 2:
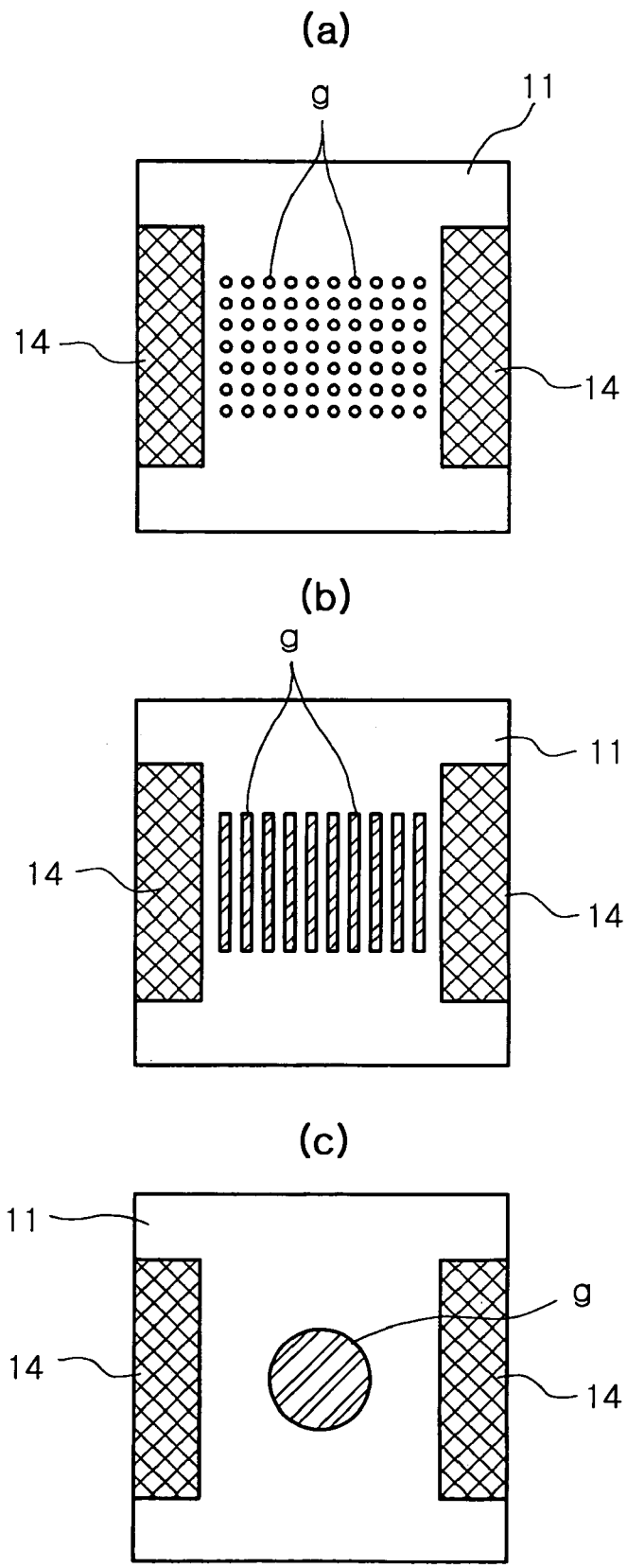
FIGS. 2(a) to (c) are plan views illustrating configuration of a heat release means according to various embodiments of the invention.

The grooves g filled with the carbon nanotube filler 13 may be formed in various configurations. FIG. 2 illustrates various configurations of the grooves. FIGS. 2(a) to (c) are bottom plan views illustrating an LED package according to various embodiments of the invention. First, as shown in FIG. 2(a), the grooves g are configured as a plurality of holes extending from an underside surface of a substrate 11 toward a top surface of the substrate 11 without perforating the substrate 11. In case where the grooves g perforate the substrate 11, the carbon nanotube filler filled in the grooves and a wiring structure formed thereon may be electrically short-circuited with each other. Thus, preferably, the grooves g do not perforate the substrate 11.

Further, as shown in FIG. 2(b), the grooves g are configured as a plurality of slits extending toward the top surface of the substrate 11 without perforating the substrate 11.

Also, as shown in FIG. 2(c), the groove g may be configured as a large hemispheric structure.

The variously structured grooves as just described are applicable to the invention. But given adherence of the carbon nanotube filler 13 filled in the grooves g onto the substrate 11, in case where the carbon nanotube is filled in the single big groove as shown in FIG. 2(c), its weight may separate the nanotube filler 23 from the substrate 11. Therefore, preferably, the grooves are structured (hole structure or slit structure) to have a small sectional area as in FIGS. 2(a) to (b) and then filled with the carbon nanotube filler.

Referring back to FIG. 1, the substrate 11 or the insulating film 111 has the plurality of upper electrodes 12 electrically connected to the LED 21. The upper electrodes 12 each are connected to an anode terminal and a cathode terminal to supply current from the outside to the LED 21. FIG. 1 illustrates the single LED chip 21 mounted in the LED package but alternatively a plurality of LED chips may be mounted therein. Thus, the number of the upper electrodes 12 can be varied adequately by the number of the LED chips 21. To be electrically connected to the outside of the LED package, the upper electrodes 12 are electrically connected to the conductive filler 15 filled in the via hole h formed thereunderneath, and the conductive filler 15 filled in the via hole h is electrically connected to lower electrodes 14 formed on the underside surface of the substrate 11. The lower electrodes 14, when supplied with current from the outside, transfers it through the via hole h and upper electrodes 12 to the LED chip 21.

FIG. 1 illustrates a structure in which the upper electrodes 12 and lower electrodes 14 are connected each other through the conductive filler 15 filled in the via hole h. The invention however is not limited thereto. Alternatively, the upper electrodes 12 each may extend to a side and underside of the substrate to be connected to the lower electrodes 14 each without the via hole h employed.

Furthermore, FIG. 1 illustrates the LED 21 chip flip-bonded to the upper electrodes 12 via a conductive bump. But the invention is not limited thereto. The LED chip 21 can be mounted over the substrate 11 via a variety of methods known in the art.

According to this embodiment, additionally, the LED package further includes a reflecting structure 16 having an inclined surface i formed around the LED chip 21 mounted over the substrate 11. The inclined surface i reflects light emitted from the LED chip 21 upwards. The reflecting structure 16 is made of a material equal to that of the substrate 11 and may surround the LED 21. The reflecting structure 16 around the LED chip 21 has sides thereof inclined toward the LED chip 21 to form the inclined surface i. The inclined surface i is coated with high-reflective material. Thus, light emitted from the LED chip 21 to the inclined surface i is reflected upwards, thereby enhancing efficiency of light exiting from the LED package 10.

Moreover, a lens 17 may be disposed over the LED chip 21 from which light is emitted so that it can control a direction of light. The lens 17 may include a plate made of glass and a micro-optics (not illustrated) of a micro lens structure formed on the glass plate. The micro-optics reflects or refracts light emitted from the underlying LED chip 21 to control light to be generated in a desired direction from the LED package 10. Also, the lens is attached to a top surface of the reflecting structure, thereby protecting the LED chip 21 from external effects.

Further, the invention provides a fabrication method of the LED package as just described.

Figure 3:
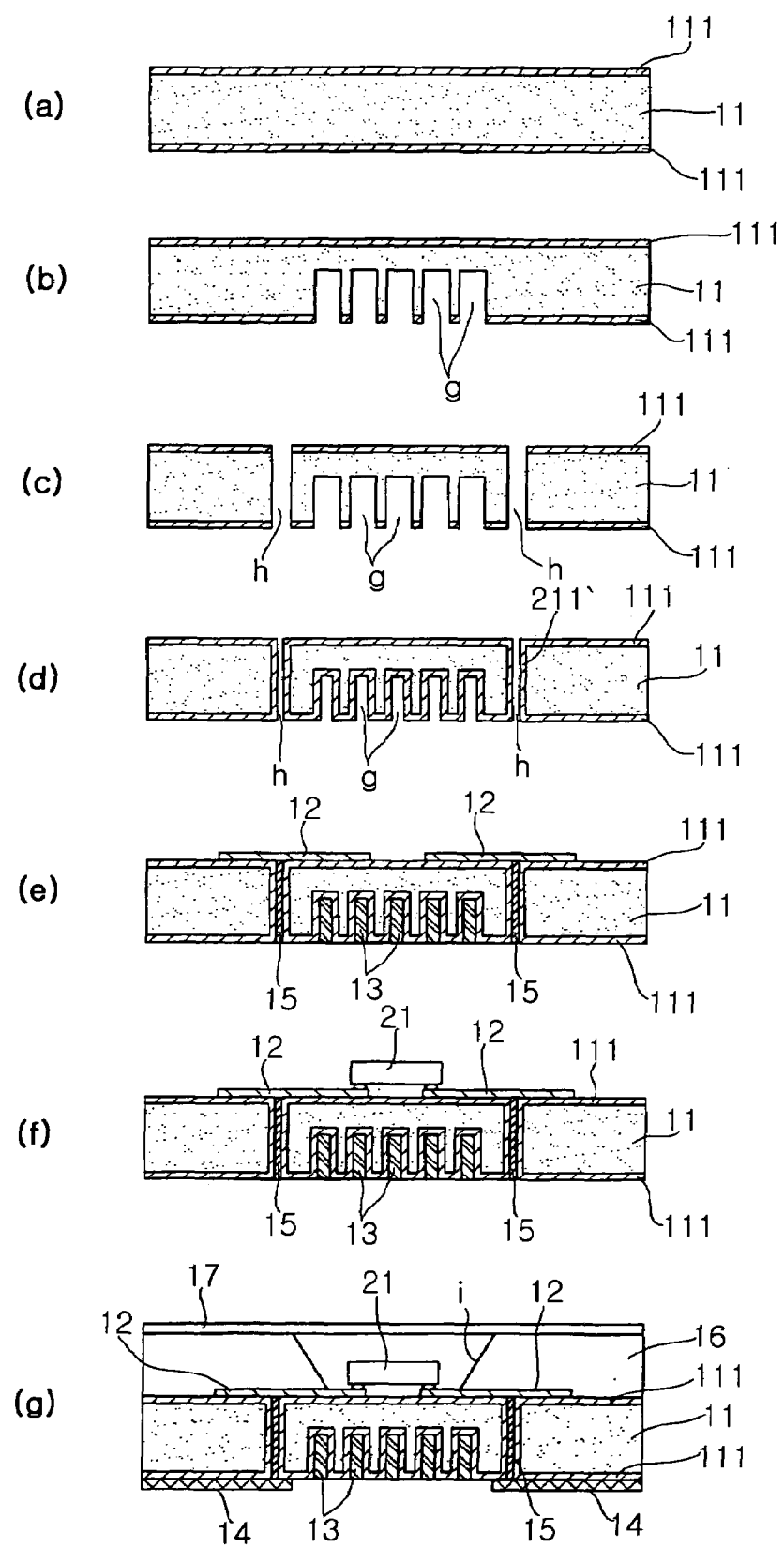
FIGS. 3(a) to (g) are cross-sectional views illustrating a method for fabricating an LED package according to the invention.

FIG. 3 illustrates in a stepwise fashion a method for fabricating the LED package according to an embodiment of the invention. The embodiment employs a Si substrate, which thus necessitate a process of forming an insulating film thereon. But such a process is omissible when an insulating substrate is adopted.

First, referring to FIG. 3(a), a substrate 11 is prepared and an insulating film 111 is formed on a top surface and an underside surface thereof. To form the insulating film 111, a material such as $SiO_2$ is deposited. Alternatively, a Si substrate is thermally treated in an oxygen atmosphere.

Next, as shown in FIG. 3(b), the insulating film 111 on the underside surface of the substrate 11 and the substrate 11 are partially removed to form grooves g. Preferably, the grooves g are formed on the underside surface of the substrate 11, below an LED chip mounted. The grooves g may be formed in various structures via mechanical drilling and chemical etching. For example, the grooves may be structured as a plurality of holes extending from the underside surface of the substrate 11 toward the top surface thereof without perforating the substrate 11. Alternatively, the grooves g may be structured as a plurality of slits extending from the underside surface of the substrate 11 toward the top surface thereof without perforating the substrate 11.

Then, as shown in FIG. 3(c), the insulating film 111 and the substrate 11 are partially removed so that via holes h are formed to perforate the top and underside surfaces of the substrate 11.

Thereafter, as shown in FIG. 3(d), the insulating film 111 is formed on inner walls of the grooves g and via holes h. To form the insulating film 111, as shown in FIG. 3(a), a material such as $SiO_2$ is deposited or the Si substrate is thermally treated in an oxygen atmosphere. Especially it is preferable to form a $SiO_2$ insulating film, which is a thermal oxide film, via thermal treatment. This thereby allows the insulating film to be formed even on inner walls of the grooves g and via holes h which have a small diameter.

Then, as shown in FIG. 3(e), the via holes (reference sign h of FIG. 3(d)) are filled with conductive filler 15. Then upper electrodes are formed on a top surface of the substrate 11 or the insulating film 111 to electrically connect to the conductive filler 13 filled in the via holes. Also, a nanotube filler 13 is filled in the grooves (reference sign g of FIG. 3(d)) formed on the underside of the substrate 11.

The carbon nanotube filler 13 is formed in a paste to be filled in the grooves. To form the carbon nanotube paste, a carbon nanotube powder is mixed with binder, solvent and dispersant at a predetermined rate. Then, the mixture is filtered and the filtered mixture is aged to complete the carbon nanotube paste. To obtain the carbon nanotube paste, 40 to 50 wt % of carbon nanotube powder, 20 to 30 wt % of binder, 20 to 30 wt % of solvent and 2 to 5 wt % of dispersant are mixed. Examples of the nanotube powder include a single wall or multiwall carbon nanotube powder. Examples of the binder include Poly Vinyl Butyral, Ethyl Cellulose, Polyester, Poly Acrylate, Poly Vinyl Pyrrolidone, and the like. Examples of the solvent include Ethyl Alcohol, Toluene, or a mixture of Ethyl Alcohol and Toluene. Also, examples of the dispersant include Glycerine, Oilfish and Dioctyl Phtahalate (DOP).

Further, to fill the carbon nanotube paste in the grooves, the carbon nano tube paste is coated onto the grooves formed on the underside surface of the substrate. Then, the carbon nanotube paste is filled in the grooves via screen printing or spin coating. In addition, the filled carbon nantotube paste is dried.

Then, as shown in FIG. 3(f), at least one LED chip 21 is mounted over the substrate 11 to electrically connect to the upper electrodes 12. The LED chip 21 can be disposed via various LED bonding methods known in the art. By way of an example, FIG. 3 illustrates the LED chip 21 flip-bonded to the upper electrodes 12 via a conductive bump and thus mounted over the substrate 11 to electrically connect to the upper electrodes 12. Alternatively, the LED chip 21 is solder bonded onto the substrate 11 or bonded thereonto via binder. Alternatively, the LED chip 21 has both terminals wire-bonded to the respective upper electrodes 12. Of course, the LED 21 may have one terminal bonded to one upper electrode and the other terminal wire-bonded to the other upper electrode.

Finally, as shown in FIG. 3(g), a reflecting structure 16 having an inclined surface i is disposed around the LED chip 21 over the substrate 11. The inclined surface i reflects light emitted from the LED chip 21 upwards. A lens 17 is disposed over the LED chip 21 to control the direction of light emitted from the LED chip 21. Also, lower electrodes 14 are formed on the underside surface of the substrate 11 to electrically connect to the conductive filler filled in the via holes, thereby completing fabrication of the LED package.

In this fashion, the invention employs carbon nanotube material with high thermal conductivity to release heat. Consequently, heat emitted from the LED chip of the LED package can be effectively released out of the package.

As set forth above, according to preferred embodiments of the invention, carbon nanotube material with high thermal conductivity is filled, thereby allowing heat emitted from an LED chip of an LED package to be effectively released out of the package. This prevents any change in output properties of the LED chip and improves useful life and reliability thereof.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
   a substrate having at least one groove formed on an underside surface thereof;
   a plurality of upper electrodes formed on a top surface of the substrate;
   at least one light emitting diode chip mounted over the substrate, the light emitting diode chip having both terminals electrically connected to the upper electrodes; and
   a carbon nanotube filler filled in the groove of the substrate.

2. The light emitting diode package according to claim 1, wherein the substrate includes at least one via hole formed underneath the upper electrodes to perforate the top and underside surfaces thereof, the via hole be filled with a conductive filler.

3. The light emitting diode package according to claim 2, further comprising a plurality of lower electrodes formed on the underside surface of the substrate to electrically connect to a conductive filler filled in the via hole.

4. The light emitting diode package according to claim 2, further comprising an insulating film formed on the top and underside surfaces of the substrate, and inner walls of the groove and the via hole.

5. The light emitting diode package according to claim 4, wherein the insulating film comprises $SiO_2$.

6. The light emitting diode package according to claim 1, further comprising a reflecting structure formed around the light emitting diode chip mounted over the substrate, the reflecting structure having an inclined surface for reflecting light emitted from the light emitting diode chip upwards.

7. The light emitting diode package according to claim 6, further comprising a lens attached to the reflecting structure over the light emitting diode, the lens controlling a direction of light emitted from the light emitting diode.

8. The light emitting diode package according to claim 1, wherein the groove comprises a plurality of holes extending from the underside surface of the substrate toward the top surface of the substrate without perforating the substrate.

9. The light emitting diode package according to claim 1, wherein the groove comprises a plurality of slits extending from the underside surface of the substrate toward the top surface of the substrate without perforating the substrate.

* * * * *